US006566619B2

(12) United States Patent
Gillman et al.

(10) Patent No.: US 6,566,619 B2
(45) Date of Patent: May 20, 2003

(54) ROCKER SWITCH WITH CENTERING TORSION SPRING

(75) Inventors: Uwe Gillman, Berlin (DE); Michael Stoffers, Berlin (DE); Michael Cemerika, Berlin (DE)

(73) Assignee: ITT Manufacturing Enterprises, Inc., Wilmington, DE (US)

(*) Notice: Subject to any disclaimer, the term of this patent is extended or adjusted under 35 U.S.C. 154(b) by 0 days.

(21) Appl. No.: 10/117,917

(22) Filed: Apr. 5, 2002

(65) Prior Publication Data

US 2003/0029706 A1 Feb. 13, 2003

(30) Foreign Application Priority Data

Apr. 7, 2001 (DE) ........................................ 101 17 597

(51) Int. Cl.[7] .......................... H01H 3/00; H01L 43/02; H02K 1/22

(52) U.S. Cl. ..................... 200/339; 200/557; 338/32 R; 338/32 H; 338/153

(58) Field of Search ................................ 200/339, 557; 335/205; 338/32 R, 32 H, 153

(56) References Cited

U.S. PATENT DOCUMENTS 4,499,449 A * 2/1985 Shinozaki et al. ........ 338/32 R
4,533,803 A * 8/1985 Beller et al. ................ 200/559
4,578,624 A * 3/1986 Neki et al. ............ 338/32 R X
5,158,172 A * 10/1992 Roeser et al. ........... 200/339 X
5,510,583 A 4/1996 Pescetto ..................... 200/1 B

FOREIGN PATENT DOCUMENTS

| DE | 871782 | 3/1953 |
|---|---|---|
| FR | 698317 | 1/1931 |

* cited by examiner

*Primary Examiner*—J. R. Scott
(74) *Attorney, Agent, or Firm*—Roger C. Turner

(57) ABSTRACT

A rocker switch with a shaft (30) that can be pivoted clockwise or counterclockwise from a neutral position, which reliably returns to the same neutral position without "play", and which is of simple design. A coil spring (25) which extends around the shaft, has front and rear opposite coil end portions (24, 26) with corresponding spring ends (27, 29), and which has a spring middle (28). Arms mounted on the shaft include a first arm (39') engaged with the front spring end and a second arm (39) positioned to engage the spring middle. When the shaft is turned clockwise from the neutral position, the arms turn the first spring end (27) and spring middle (28) clockwise while loading only the rear coil end portion (26). When the shaft turns counterclockwise, the spring middle (28) is prevented from turning by a spring center support (43), so only the front coil portion (24) is loaded.

12 Claims, 3 Drawing Sheets

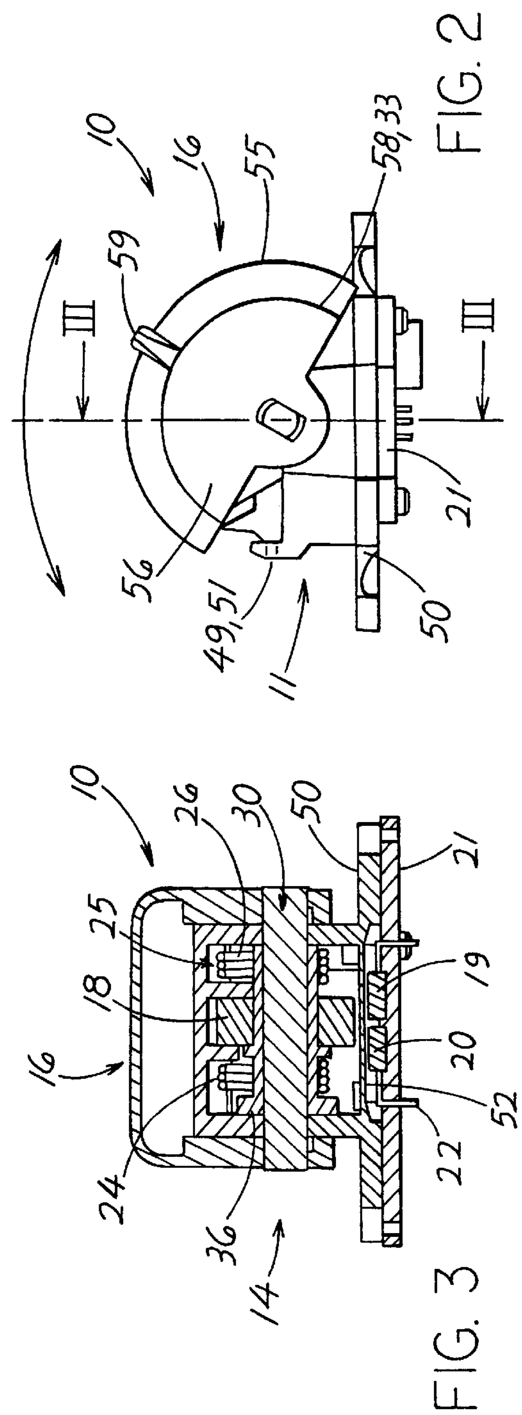
FIG. 2
10
16
55
59
58,33
III
III
56
21
49,51
50
11
FIG. 3
10
16
26
30
50
25
18
21
19
24
20
36
52
22
14
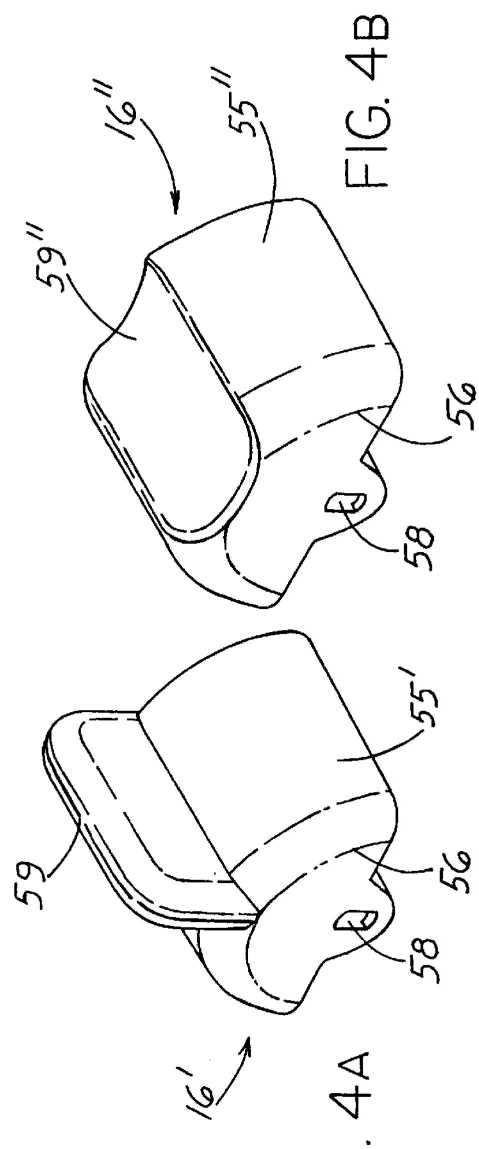
FIG. 4B
16''
55''
59''
56
58
FIG. 4A
55'
59
56
58
16'

28
30
27
43
39
39'

39
28
30

31
43
A
C
100
27

30
27

28
D
39'
B
43
39

ROCKER SWITCH WITH CENTERING TORSION SPRING

CROSS-REFERENCE TO RELATED APPLICATION

Applicant claims priority from German patent application No. 101 17 597.3 filed Apr. 7, 2001.

BACKGROUND OF THE INVENTION

In prior rocker switches, a spring biases the shaft toward a neutral position while allowing the shaft to turn clockwise or counterclockwise from the neutral position. The exact position of the shaft at the neutral position varies, depending upon the relative forces applied in opposite directions. It is very difficult to manufacture springs so their forces are equal, or so their forces remain equal over a long period of time. In addition to the variation of the neutral position, there is often play in the shaft, in that noticeable resistance to turning of the shaft in either direction occurs only after a slight rotation of the shaft, which is sometimes annoying. A rocker switch of simple design, which had a constant neutral position and which avoided play in the shaft, would be of value.

SUMMARY OF THE INVENTION

In accordance with one embodiment of the present invention, a rocker switch is provided, wherein the shaft that can pivot or rock clockwise and counterclockwise from a neutral position, is reliably held in a constant neutral position, without play, in a switch of simple and rugged construction. A coil spring which extends around the shaft, has front and rear opposite coil end portions with corresponding front and rear spring ends. The spring also has a spring middle that connects the front and rear coil end portions. The shaft has a pair of arms, with a first arm engaging the front spring end and a second arm positioned to engage the spring middle when the shaft turns clockwise, and to pivot away from the spring middle when the shaft turns counterclockwise. The housing has a spring center support that engages the spring middle in its neutral position and that prevents the spring middle from moving counterclockwise from the neutral position while allowing the spring middle to move clockwise from the neutral position. As a result, when the shaft turns clockwise, the front spring end and spring middle turn clockwise and the rear coil end portion is loaded. When no pivoting force is applied to the shaft, the rear coil portion holds the spring middle against the spring center. When the shaft is turned counterclockwise, only the front spring end is turned counterclockwise while the spring middle is prevented from turning, and the first coil end portion is loaded.

A ring magnet is mounted on the shaft to turn with it and operate a magnetic field sensor such as a Hall sensor. The opposite coil end portions lie beyond opposite ends of the ring magnet, and the spring middle extends across the spring magnet.

The novel features of the invention are set forth with particularity in the appended claims. The invention will be best understood from the following description when read in conjunction with the accompanying drawings.

BRIEF DESCRIPTION OF THE DRAWINGS

FIG. 2 is a front elevation view of the fully assembled switch of FIG. 1, with the actuator pivoted clockwise from the neutral position.

FIG. 3 is a sectional view taken on line III—III of FIG. 2.

FIG. 4A shows an actuator of another embodiment of the invention, which can substitute for the actuator of FIG. 1.

FIG. 4B shows another actuator which can be substituted for the actuator of FIG. 1.

DESCRIPTION OF THE PREFERRED EMBODIMENTS

Figure 1:
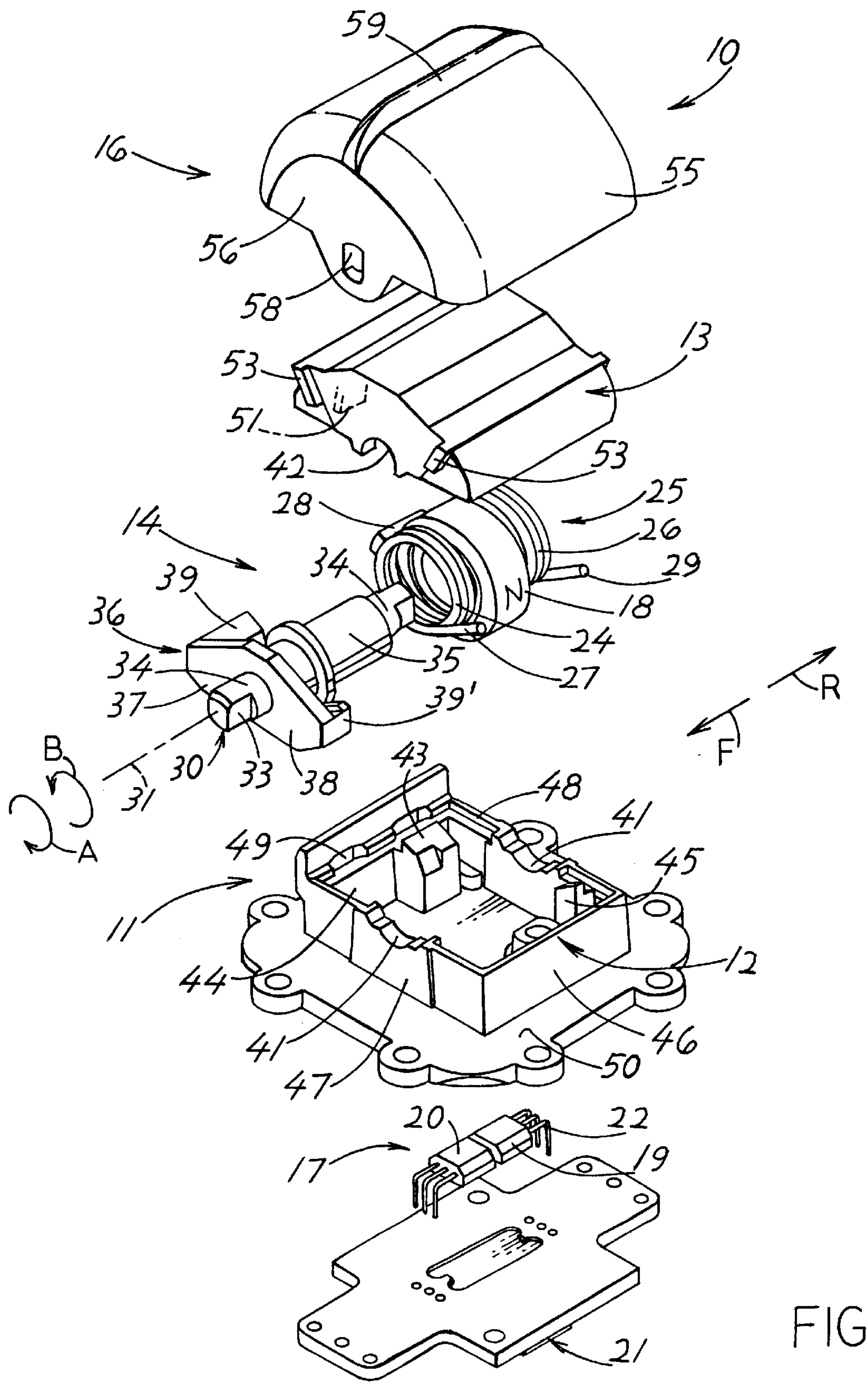
FIG. 1 is an exploded isometric view of a rocker switch constructed in accordance with one embodiment of the present invention.

FIG. 1 shows a rocker switch 10 which includes a housing 11 having a lower housing part 12 that is opened at the top, and an upper housing part 13 that covers the opening in the lower part. The switch comprises an actuator arrangement 14 that includes a shaft 30 that can pivot about an axis 31 that extends in forward F and rearward R directions, on the housing. The shaft has flattened key ends 33 that fit closely within key apertures 58 in a rocker actuator 16. Thus, when the actuator 16 is pivoted clockwise A or counterclockwise B (assuming one is looking in the rearward R direction) the shaft 30 will pivot in those directions.

A ring-shaped permanent magnet 18 is mounted on a cylindrical mount portion 35 of the shaft to turn with the shaft. This can be accomplished by a press fit of the magnet on the shaft or by a key or other means. The magnet has north and south poles at diametrically opposite sides of the ring, with the north pole marked with an N. A pair of magnetic field sensors 19, 20, which are preferably Hall sensors, have terminals 22 connected to traces on a circuit board 21. The Hall sensors form a contactless switch unit 17 that senses when the shaft and the magnet 18 turn clockwise or counterclockwise from the neutral position.

The shaft is maintained in a neutral position and biased back towards the neutral position when it is pivoted in either direction A, B from the neutral position, by a coil spring 25. The coil spring preferably lies around the cylindrical mount portion 35 of the shaft for easy mounting, although most of the coil spring is not fixed to the shaft. The coil spring has a first or front coil portion 24 with a first or front end 27. The coil spring also has a second or rear coil portion 26 with a second or rear end 29. Furthermore, the spring has a spring middle 28 that extends between the front and rear coil portions. The spring middle 28 preferably extends outside the ring-shaped permanent magnet 18, although the spring middle could extend within the magnet or through a bore in it.

A lever 37 is fixed to the shaft and has a pair of arms, or parts 39, 39' on diametrically opposite sides of the shaft axis. A first of the arms 39' is engaged with the front spring end 27 during turning of the shaft in either direction A, B. The second arm 39 is positioned to engage the spring middle 28 when the shaft is turned clockwise A but not when the shaft is turned counterclockwise B from the neutral position.

Figure 5:
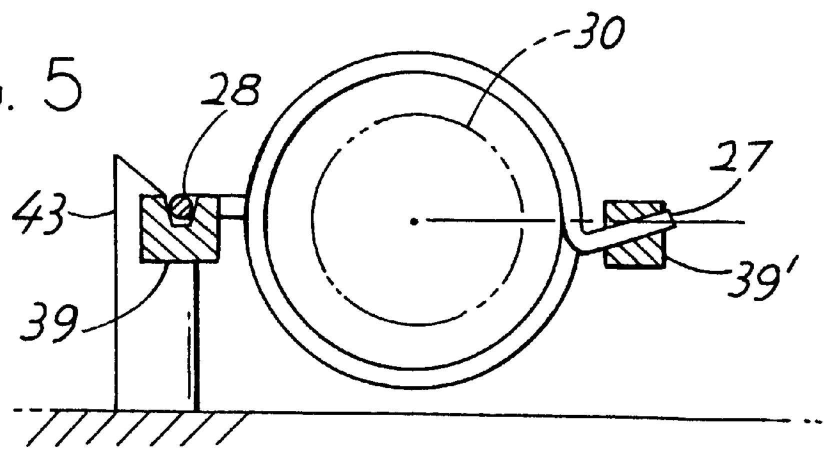
FIG. 5 is a partial front view of the assembled switch of FIG. 1, shown in a neutral position.

FIG. 5 is a schematic view showing how the shaft and spring interact during pivoting of the shaft. In FIG. 5, the shaft is in a neutral position. It can be seen that the spring first end 27 is captured by the first arm 39'. The spring middle 28 rests against a spring center support 43 of the housing, and a second arm 39 lies against the spring middle.

Figure 6:
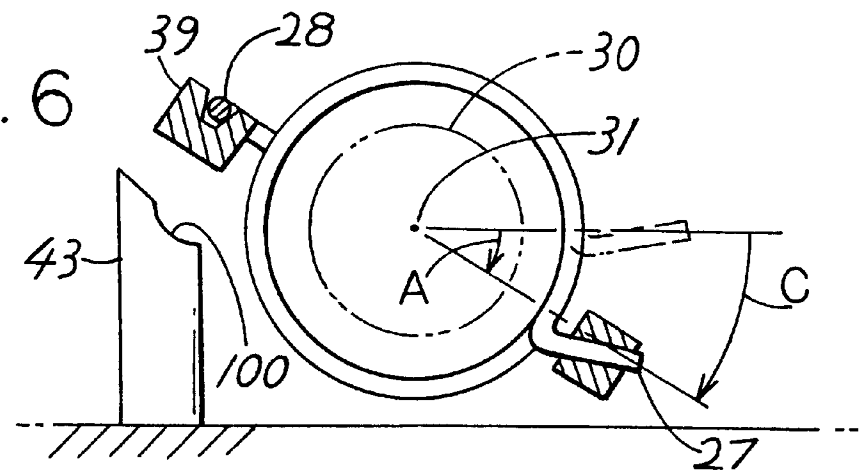
FIG. 6 is a view similar to FIG. 5, but with the shaft having been pivoted clockwise from the neutral position to a clockwise position.

FIG. 6 shows the position of the shaft 30 after it has been turned clockwise by angle C such as 30° from the neutral position. The first arm 39' has turned the front spring end 27 by 30° about the axis 31 and the second arm 39 has turned the spring middle 28 by 30° about the axis. When the shaft has been turned 30° in the clockwise direction A, the rear coil portion 26 (FIG. 1) of the spring has been loaded. That is, while the rear or second end 29 of the spring cannot turn, the spring middle 28 has turned by perhaps 30°, applying further torque loading to the spring rear coil portion 26, which increases the energy stored in the rear coil portion. It is noted that the spring coil rear portion 26 is under slight compression even when the shaft is in the neutral position, to push the spring middle 28 against the spring center support 43.

Figure 7:
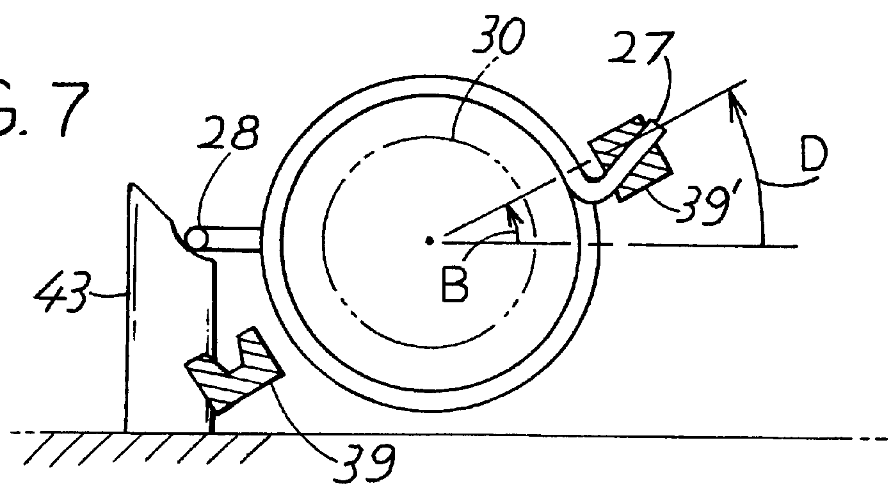
FIG. 7 is a view similar to FIG. 5, but with the shaft having been pivoted counterclockwise from the neutral position to a counterclockwise position.

FIG. 7 shows the shaft 30 after it has turned by an angle D such as 30° in the counterclockwise direction B away from the neutral position. Although the first arm 39' remains engaged with the spring front end 27, the second arm 39 turns without engagement with the spring middle 28, because the spring middle continues to be held by the spring center support 43. As a result, the front coil portion 24 (FIG. 1) of the spring is loaded by applying torque between its opposite ends (which are at 27 and 28).

As shown in FIG. 5, when the shaft is in it neutral position, preloading of the rear coil portion assures that the spring middle 28 presses against the spring center support 43, which fixes the position of the shaft 30 in the neutral position. That is, the shaft remains in the neutral position, with second arm 39 pressing lightly against the spring middle 28 when substantial torque is not applied to the shaft in either the clockwise or counterclockwise directions. The front coil portion is preferably under slight loading, or torque, so the second arm 39 presses with a very light force upward against the spring middle. Such upward force of the second arm 39 is not required, but if not present this results in slight play in the shaft.

Applicant prefers to wind the front and rear coil portions 24, 26 (FIG. 1) in opposite directions. That is, the front coil position 24 advances rearwardly along a counterclockwise direction, while the rear coil portion 26 advances rearwardly in a clockwise direction. While the coil spring is shown wound in a helix, it could be wound in a spiral or a combined helix and spiral (a conical helix) or in other ways. It is possible to use coil or leaf springs that do not lie around the shaft and whose axis is not parallel to the shaft. In that case, the first and second arms are coupled to one spring end and to the spring middle, respectively.

The circuit board 21 (FIG. 1) is fastened to the bottom of the lower housing part 12 by screws, and the circuit board acts as a housing lower wall. The cover 13 is fastened to the lower housing base 50 by screws. The lower housing part forms about half of a pivot bearing by recesses 41, and the upper housing part or cover 13 forms a pair of bearing recesses at 42. The shaft has bearing regions 34 near its opposite ends, that are cylindrical and that can easily pivot within the bearing formed by each pair of recesses. The cover has a projection 51 that fits into a slot 49 in the lower housing part. The lower housing part has a spring end engager 45 that is engaged with the spring rear end 29 to prevent the rear end from moving down (clockwise).

The Hall sensors 19, 20 are received in recesses 52 (FIG. 3) in the base 50 of the lower housing part. Two Hall sensors are provided instead of one, for redundancy and therefore greater reliability. The circuit board can hold additional electrical components on its lower face.

Although a variety of actuators can be coupled to the shaft to turn it, including a simple handle fixed to one end of the shaft, applicant prefers to use the rocker 16 shown in FIG. 1. The rocker 16 has a simi-cylindrical outer surface 55, flat forward and rearward surfaces 56, and an actuator web 59 that can be easily moved by the finger of a person. FIGS. 4A and 4B show other shapes of actuators 16' and 16". The actuator 16' of FIG. 4A has a taller and thicker web 59 on its external surface 55'. The actuator 16" has a depression 59" in its external surface 55". The actuators are designed to limit pivoting of the shaft by a predetermined angle in either direction, such as plus minus 30°. To this end, the housing cover 13 (FIG. 1) has stops 53 that limit pivoting of the rocker actuator.

Although a single spring 25 is shown in FIG. 1, two separate springs can be used, with one end of each spring forming the spring middle 28. Although a contactless switch is shown, the shaft could be provided with parts that depress one contact against another contact to close a switch (or open a switch). The arms do not have to have the shape of an arm, but can have any shape.

Thus, the invention provides a rocker switch of the type that has a shaft that can pivot in clockwise and counter-clockwise directions from a neutral position, which consistently maintains the shaft in the neutral position, preferably without play, and in a switch of simple design. A coil spring has front and rear coil portions with corresponding spring ends, and has a spring middle that joins the coil end portions. The shaft has a pair of arms, with one arm engaging the first spring end and the other arm positioned "in line" with the spring middle to engage it when the shaft is forced to turn clockwise. The second arm disengages from the spring middle when the shaft turns counterclockwise, the spring middle then being supported by a spring center support that prevents the spring from moving counterclockwise past the neutral position. The front spring portion is preferably preloaded so the second arm remains engaged with the spring middle, but the rear coil portion is preloaded to a higher loading so that it keeps the spring middle pressed against the spring center support when no torque is applied to the shaft. The pivot directions can be viewed from the front (FIG. 2), or can be viewed from the rear in which case the clockwise and counterclockwise directions are reversed.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A rocker switch comprising:

a housing;

a shaft which is pivotally mounted about a pivot axis on said housing so said shaft can pivot between a neutral position, a clockwise position angled clockwise from said neutral position, and a counterclockwise position angled counterclockwise from said neutral position;

at least one spring which biases said shaft toward said neutral position while allowing the shaft to be pivoted in clockwise and counterclockwise directions therefrom;

said spring having first and second coil end portions that have respective first and second spring ends, and said spring having a spring middle between said coiled end portions;

said shaft having first and second arms that respectively engage said first spring end and said spring middle;

said housing having a spring housing support part that prevents said spring middle from pivoting counterclockwise beyond said neutral position, said first arm being pivotable counterclockwise while said spring middle is prevented from pivoting counterclockwise to thereby load said spring first coil portion, said second spring end being coupled to said housing to prevent it from pivoting clockwise so when said shaft and said second arm turn clockwise said spring middle moves clockwise and said second coil portion is loaded.

2. The switch described in claim 1 wherein:

said spring is mounted to bias said spring middle against said housing support part, to thereby maintain a constant neutral position of the shaft.

3. The switch described in claim 1 wherein:

said first and second coil portions are wound in different directions so one of them advances clockwise in a first axial direction and the other advances counterclockwise and in said first axial direction.

4. The switch described in claim 1 including:

a permanent magnet mounted on said shaft and a magnetic field sensor mounted on said housing, said magnet being a ring magnet with North and South poles on diametrically opposite sides of said ring, and said North and South poles are about equally spaced form said sensor when said shaft is in said neutral position with different ones of said poles moving closer to said sensor as said shaft is turned in different ones of said clockwise and counterclockwise directions.

5. A rocker switch comprising:

a housing;

a shaft pivotally mounted about an axis on said housing to turn clockwise and counterclockwise from a neutral position;

at least one coil spring which has first and second opposite coil portions with respective first and second spring ends, and which has a spring middle, said spring second end being held by said housing against movement in a clockwise direction;

said shaft having a pair of arms, including a first arm engaged with said first spring end, and including a second arm positioned to engage said spring middle when said shaft turns clockwise from said neutral position but not when said shaft turns counterclockwise from said neutral position;

said housing having a spring center support that is position to engage said spring middle to prevent it from moving counterclockwise from the neutral position while allowing said spring middle to move clockwise from said neutral position.

6. The switch described in claim 5 including:

a permanent magnet fixed to said shaft, and a magnetic field sensor connected to said housing;

said permanent magnet being a ring magnet with a hole that receives said shaft, said spring coil end portions lying on opposite sides of said ring magnet, and said spring middle passing across said ring magnet.

7. The switch described in claim 5 wherein:

said spring second coil portion is preloaded to press said spring middle against said spring center support.

8. The switch described in claim 7 wherein:

said spring first coil end portion is preloaded to press said second arm clockwise to keep said second arm engaged with said spring middle.

9. The switch described in claim 5 wherein:

said coil spring opposite coil end portions are each of substantially cylindrical shape and are wound in opposite directions.

10. The switch described in claim 5 wherein:

said housing has upper and lower housing parts, said lower housing part having an open upper end and said upper housing part closes said open upper end; and including an actuator that has an upper part that lies above said upper housing part, and that has front and rear largely flat end parts that depend from front and rear ends of said upper part and that each has a lower portion engaged with said shaft.

11. A rocker switch comprising:

a housing that has longitudinal spaced front and rear walls;

a shaft which is pivotally mounted about a longitudinally-extending pivot axis on said housing so said shaft can pivot clockwise and counterclockwise from a neutral position;

at least one spring that biases said shaft toward said neutral position;

said housing having a lower housing part with an open upper end and a cover that covers said open upper end;

an actuator that has an upper actuator part that lies primarily above said upper housing part and that has front and rear actuator walls that extend downwardly from front and rear ends of said upper actuator part, said front and rear actuator walls each being fixed against rotation to said shaft and said actuator being pivotable with said shaft about said axis in clockwise and counterclockwise directions from the neutral position.

12. The rocker switch described in claim 11 wherein:

said spring is a coil spring that lies around said shaft and that has front rear coil end portions with respective front and rear ends, said spring also having a spring middle extending between said coil portions;

said shaft having a first part engaged with said front spring end and a second part positioned to engage said spring middle when said shaft turns clockwise from said shaft neutral position;

said housing having a spring center support that is positioned in line with movement of said spring center to engage said spring center and prevent it from pivoting counterclockwise from a neutral spring center position.

* * * * *